United States Patent
Lin et al.

(10) Patent No.: US 11,381,427 B1
(45) Date of Patent: Jul. 5, 2022

(54) CONTINUOUS-TIME LINEAR EQUALIZER OF COMPACT LAYOUT AND HIGH IMMUNITY TO COMMON-MODE NOISE

(71) Applicant: Realtek Semiconductor Corp., Hsinchu (TW)

(72) Inventors: Chia-Liang (Leon) Lin, Fremont, CA (US); Ting-Hsu Chien, San Jose, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/347,632

(22) Filed: Jun. 15, 2021

(51) Int. Cl.
*H04L 25/00* (2006.01)
*H04L 25/03* (2006.01)
*H03G 5/28* (2006.01)
*H03F 3/45* (2006.01)

(52) U.S. Cl.
CPC ... *H04L 25/03878* (2013.01); *H03F 3/45524* (2013.01); *H03G 5/28* (2013.01)

(58) Field of Classification Search
CPC ......... H04L 25/03878; H04L 25/03885; H04L 27/01; H04L 25/0278; H03F 3/45524
See application file for complete search history.

(56) References Cited

U.S. PATENT DOCUMENTS

| | | | | |
|---|---|---|---|---|
| 9,225,560 | B1 * | 12/2015 | Mishra | H04L 25/03019 |
| 10,075,141 | B1 * | 9/2018 | Nagulapalli | H04L 25/03878 |
| 10,263,815 | B1 * | 4/2019 | Geary | H04L 25/03878 |
| 10,637,695 | B1 * | 4/2020 | Venkatesan | H04L 25/063 |
| 2019/0081604 | A1 * | 3/2019 | Thiagarajan | H03G 5/28 |
| 2021/0305941 | A1 * | 9/2021 | Takeuchi | H04L 25/03878 |

OTHER PUBLICATIONS

Razavi Behzad "The Active Inductor [A Circuit for All Seasons]", Jun. 2020, IEEE Solid-State Circuits Magazine (vol. 12, Issue : 2, Spring 2020), pp. 7-11. (Year: 2020).*

* cited by examiner

*Primary Examiner* — Sophia Vlahos
(74) *Attorney, Agent, or Firm* — McClure, Qualey & Rodack, LLP

(57) ABSTRACT

A continuous-time linear equalizer (CTLE) having a common-source amplifier configured to receive an input signal and output an output signal in accordance with a biasing current; a current source controlled by a first bias voltage and configured to output the biasing current; an active load controlled by a second bias voltage and configured to be a load of the common-source amplifier; a common-mode sensing circuit configured to sense a common-mode voltage of the output signal; a current source controller configured to output the first bias voltage in accordance with the common-mode voltage and a reference voltage derived from a supply voltage of the active load and a first reference current; and an active load controller configured to output the second bias voltage in accordance with the supply voltage of the active load and a second reference current.

10 Claims, 3 Drawing Sheets

CONTINUOUS-TIME LINEAR EQUALIZER OF COMPACT LAYOUT AND HIGH IMMUNITY TO COMMON-MODE NOISE

BACKGROUND OF THE DISCLOSURE

Field of the Disclosure

This present invention generally relates to continuous-time linear equalizers, and more particularly to continuous-time linear equalizers of compact layout and having high immunity to common-mode noise.

Description of Related Art

A continuous-time linear equalizer (hereafter CTLE) receives an input signal and outputs an output signal in accordance with a gain factor that is frequency dependent. In an embodiment, the gain factor is larger when a frequency of the input signal is higher. As depicted in FIG. 1, a prior art CTLE 100 comprises: a bias voltage generator 110 comprising a diode-connected NMOS transistor 111 configured to receive a reference current $I_{REF}$ and establish a bias voltage $V_B$ accordingly; a current source 140 comprising two NMOS transistors 141 and 142 and configured to output two bias currents $I_{bias+}$ and $I_{bias-}$, respectively, in accordance with the bias voltage $V_B$; a common-source amplifier 120 comprising two NMOS transistors 121 and 122 configured to receive an input signal comprising two input voltages $V_{I+}$ and $V_{I-}$ and output an output signal comprising two output voltages $V_{O-}$ and $V_{I+}$ in accordance with the two bias currents $I_{bias+}$ and $I_{bias-}$, respectively; a load circuit 130 comprising two inductors 131 and 132 and two resistors 133 and 144 and configured to be a load of the common-source amplifier 120; and a source degeneration circuit 150 comprising a parallel connection of a resistor 151 and a capacitor 152 and configured to degenerate the common-source amplifier 120. Here, "$V_{DD}$" denotes a power supply node. A gain of CTLE 100 is determined by an impedance of the load circuit 130 and an impedance of the source degeneration circuit 150: a larger impedance of the load circuit 130 leads to a higher gain, so does a lower impedance of the source degeneration circuit 150. An input signal of a higher frequency sees a higher impedance of the load circuit 130 and a smaller impedance of the source degeneration circuit 150 and thus has a higher gain. CTLE 100 is well known in the prior art and thus not explained in detail here.

There are two common issues with CTLE 100. First, inductors 131 and 132 can effectively enlarge an impedance of the load circuit 130 at a high frequency and thus boost a high-frequency gain for the common-source amplifier 120, but inductors are relatively expensive components; in an embodiment wherein CTLE 100 is fabricated on a silicon substrate as integrated circuits, inductors 131 and 132 tend to occupy a large layout area. Second, in a presence of a common-mode noise, a common-mode voltage of the two input voltages $V_{I+}$ and $V_{I-}$ may drop and the two bias currents $I_{B+}$ and $I_{B-}$ will also drop due to a finite output impedance of the current source 140; this will result in a drop of a gain of the CTLE 100.

What is desired is a CTLE that is efficient in layout area and highly insensitive to a common-mode noise.

SUMMARY OF THE DISCLOSURE

In an embodiment, a CTLE comprises: a common-source amplifier configured to receive an input signal and output an output signal in accordance with a biasing current; a current source controlled by a first bias voltage and configured to output the biasing current; an active load controlled by a second bias voltage and configured to be a load of the common-source amplifier; a common-mode sensing circuit configured to sense a common-mode voltage of the output signal; a current source controller configured to output the first bias voltage in accordance with the common-mode voltage and a reference voltage derived from a supply voltage of the active load and a first reference current; and an active load controller configured to output the second bias voltage in accordance with the supply voltage of the active load and a second reference current.

DETAILED DESCRIPTION OF THIS DISCLOSURE

Figure 1:
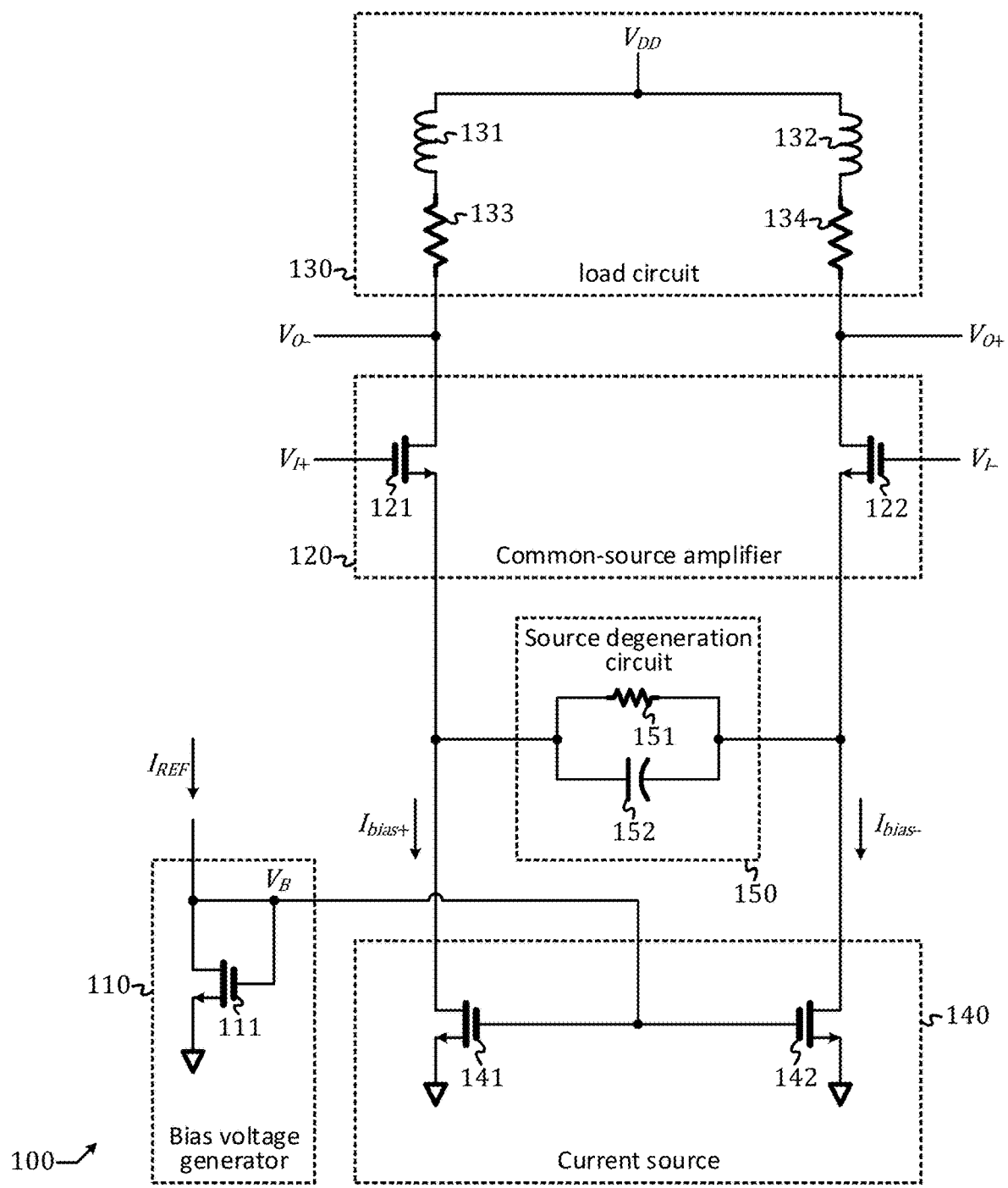
FIG. 1 shows a schematic diagram of a prior art continuous-time linear equalizer.

The present disclosure is directed to continuous-time linear equalizer. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "common-mode," "gain," "bias," "current source," "impedance," "DC (direct current)," "operational amplifier," "inductor," "capacitor," "resistor," "common-source amplifier," "load," "source degeneration," "parallel connection," "circuit node," "ground," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skills in the art understand units such as nH (nano-Henry), pF (pico-Farad), fF (femto-Farad), nm (nanometer), and μm (micron) without a need of explanations.

Those of ordinary skills in the art can read schematics of a circuit comprising electronic components such as capacitors, resistors, NMOS transistors, PMOS transistors, and so on, and do not need a verbose description about how one component connects with another in the schematics. Those of ordinary skill in the art can also recognize a ground symbol, a capacitor symbol, an inductor symbol, a resistor symbol, an operational amplifier symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A MOS transistor, PMOS or NMOS, has a threshold voltage. A MOS transistor is turned on when its gate-to-source voltage is larger than its threshold voltage (in absolute value). When a MOS transistor is turned on, a difference between its gate-to-source voltage and its threshold voltage in absolute value is referred to as an "over-drive voltage." A MOS transistor is in a "saturation region" when it is turned on and its over-drive voltage is smaller than its drain-to-source voltage (in absolute value). A MOS transistor is an effective gain device only when it is in the "saturation region."

A circuit is a collection of a transistor, a capacitor, a resistor, and/or other electronic devices inter-connected in a certain manner to embody a certain function.

In this disclosure, a "circuit node" is frequently simply stated as a "node" for short, when what it means is clear from a context.

A signal is a voltage of a variable level that carries a certain information and can vary with time. A level of the signal at a moment represents a state of the signal at that moment. In this present disclosure, "signal" and "voltage signal" refer to the same thing and thus are interchangeable.

Throughout this disclosure, a differential signaling scheme is widely used. When embodied in a differential signaling scheme, a signal comprises two voltages denoted with suffixes "+" and "−," respectively, appended in subscript format, and a value of the signal is represented by a difference between said two voltages. For instance, a signal $V_1$ ($V_2$) in a differential signaling embodiment comprises two voltages $V_{1+}$ ($V_{2+}$) and $V_{1-}$ ($V_{2-}$) and a value of the signal $V_1$ ($V_2$) is represented by a difference between $V_{1+}$ ($V_{2+}$) and $V_{1-}$ ($2_{c-}$). $V_{1+}$ ($V_{2+}$) is said to be a first end of $V_1$ ($V_2$); $V_{1-}$ ($V_{2-}$) is said to be a second end of $V_1$ ($V_2$); the first end is also referred to as a positive end; the second end is also referred to as a negative end. A mean value of a first end and a second end of a signal in a differential signal embodiment is referred to as a "common-mode" voltage of said signal.

Figure 2:
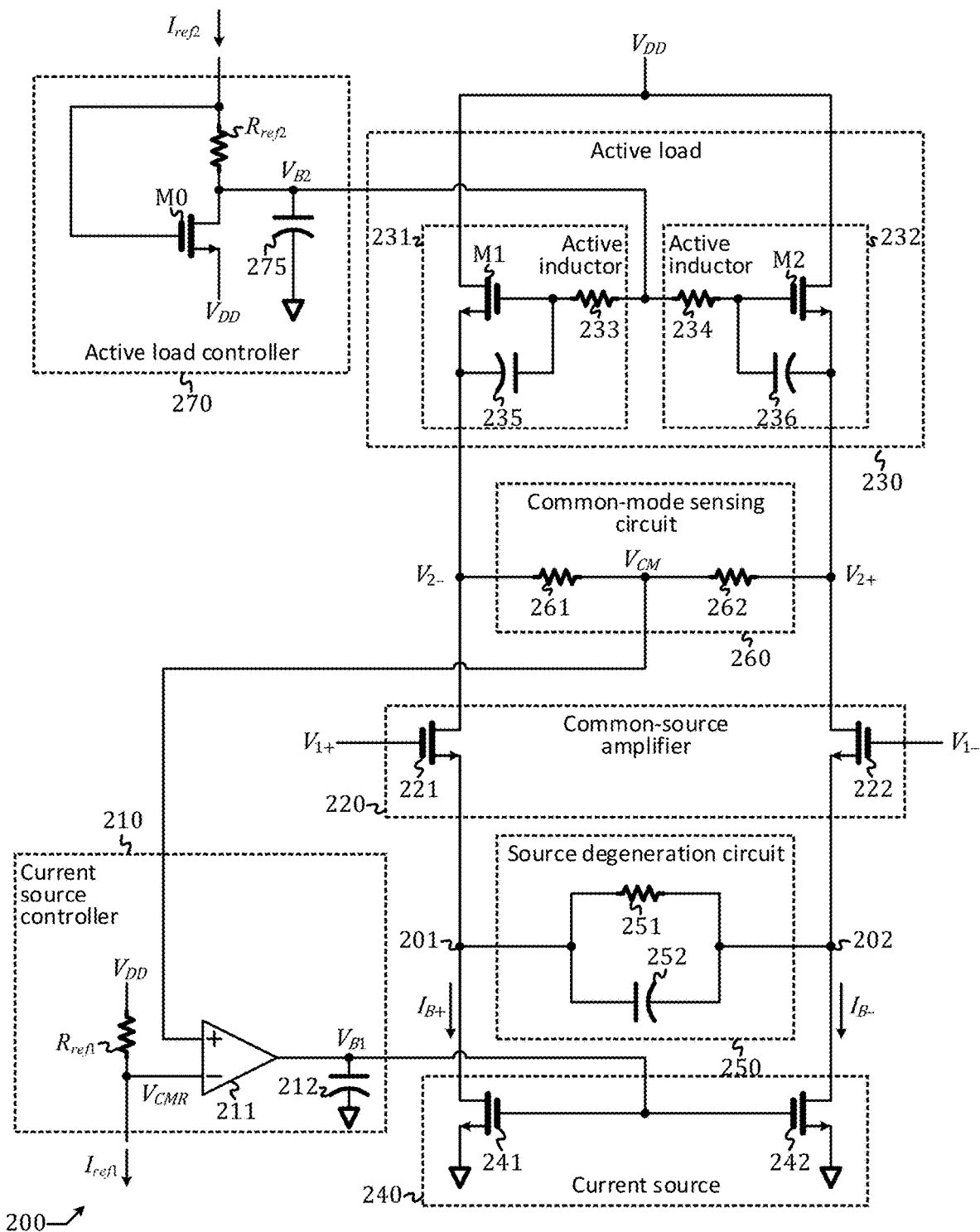
FIG. 2 shows a schematic diagram of a continuous-time linear equalizer in accordance with an embodiment of the present disclosure.

A schematic diagram of a CTLE 200 in accordance with an embodiment of the present disclosure is shown in FIG. 2. CTLE 200 comprises: a common-source amplifier 220 configured to receive a first signal $V_1$ (comprising two input voltages including a first input voltage $V_{1+}$ and a second input voltage $V_{1-}$ in a differential signal embodiment) and output a second signal $V_2$ (comprising two output voltages including a first output voltage $V_{2+}$ and a second output voltage $V_{2-}$ in a differential signal embodiment) in accordance with a biasing current comprising two bias currents including a first bias current $I_{B+}$ and a second bias current $I_{B-}$; a current source 240 configured to generate the two bias currents $I_{B+}$ and $I_{B-}$ in accordance with a control of a first bias voltage $V_{B1}$; a source degeneration circuit 250 configured to degenerate the common-source amplifier 220; an active load 230 supplied by a supply voltage $V_{DD}$, controlled by a second bias voltage $V_{B2}$, and configured to be a load of the common-source amplifier 220; a common-mode sensing circuit 260 configured to detect a common-mode voltage $V_{CM}$ of the second signal $V_2$; a current source controller 210 configured to output the first bias voltage $V_1$ in accordance with a difference between the common-mode voltage $V_{CM}$ and a reference voltage $V_{CMR}$ derived from the supply voltage $V_{DD}$ and a first reference current $I_{ref1}$; and an active load controller 220 configured to output the second bias voltage $V_{B2}$ in accordance with the supply voltage $V_{DD}$ and a second reference current $I_{ref2}$.

Common-source amplifier 220 comprises two NMOS transistors 221 and 222 configured to receive $V_{1+}$ and $V_{1-}$ and output $V_{2-}$ and $V_{2+}$ in accordance with a biasing of $I_{B+}$ and $I_{B-}$, respectively. Current source 240 comprises two NMOS transistors 241 and 242 and is configured to output the two bias currents $I_{B+}$ and $I_{B-}$, respectively, in accordance with a control of the first bias voltage $V_{B1}$. The source degeneration circuit 250 comprises a parallel connection of a resistor 251 and a capacitor 252 across two source node 201 and 202. Source node 201 connects to the source of NMOS transistor 221 and the drain of NMOS transistor 241, while source node 202 connects to the source of NMOS transistor 222 and the drain of NMOS transistors 242. Active load 230 comprises a first active inductor 231 comprising an NMOS transistor M1, a gate resistor 233, and a gate-to-source capacitor 235 and a second active inductor 232 comprising an NMOS transistor M2, a gate resistor 234, and a gate-to-source capacitor 236. Resistor 233 (234) is referred to as a gate resistor because it connects to the gate of NMOS transistor M1 (M2); capacitor 235 (236) is said to be a gate-to-source capacitor because it connects from the gate to the source of NMOS transistor M1 (M2). That an NMOS transistor along with a gate resistor and a gate-to-source capacitor can embody an active inductor is well known in the prior art and thus not described in detail here.

Active inductors 231 and 232 are biased by the second bias voltage $V_{B2}$ via gate resistors 233 and 234, respectively. For active inductors 231 and 232 to function effectively as an inductive load, NMOS transistors M1 and M2 must remain in the saturation region. The second bias voltage $V_{B2}$ is controlled to ensure a drain-to-source voltage is greater than an over-drive voltage for both NMOS transistors M1 and M2 to remain in the saturation region. This is accomplished by using the active load controller 270, which comprises an NMOS transistor M0, a resistor $R_{ref2}$, and a capacitor 275. Resistor $R_{ref2}$ is inserted between the drain and the gate of NMOS transistor M0, while the source of NMOS transistor M0 connects to the supply voltage $V_{DD}$. The second bias voltage $V_{B2}$ is tapped from the drain of NMOS transistor M0 and is held by capacitor 275. This way, the second bias voltage $V_{B2}$ is a step up above the supply voltage $V_{DD}$ with an amount determined by the second reference current $I_{ref2}$ and resistor $R_{ref2}$. The second reference current $I_{ref2}$ flows into the drain of NMOS transistor M0 via resistor $R_{ref2}$, and a drain-to-source voltage $V_{ds0}$ of NMOS transistor M0 can be written as:

$$V_{ds0} = V_{th0} + V_{od0} - I_{ref2} R_{ref2} \qquad (1)$$

Here, $V_{th0}$ and $V_{od0}$ denote a threshold voltage and an over-drive voltage of NMOS transistor M0, respectively.

In an embodiment, $I_{ref2} R_{ref2} \leq V_{th0}$, and it is evident from equation (1) that $V_{ds0} \geq V_{od0}$, and NMOS transistor M0 can remain in the saturation region.

The second bias voltage $V_{B2}$ is:

$$V_{B2} = V_{DD} + V_{ds0} = V_{DD} + V_{th0} + V_{od0} - I_{ref2} R_{ref2} \qquad (2)$$

The common-mode sensing circuit 260 comprises two identical resistors 261 and 262 inserted between $V_{2-}$ and $V_{2+}$, so that the common-mode voltage $V_{CM}$ is equal to a mean of $V_{2-}$ and $V_{2+}$. In a zero-input scenario wherein both $V_{1+}$ and $V_{1-}$ are equal to a common DC (direct current) voltage, $V_{2+}$ and $V_{2-}$ are both equal to the common-mode voltage $V_{CM}$, and a drain-to-source voltage $V_{ds1}$ of M1 and a drain-to-source voltage $V_{ds2}$ of M2 are both equal to $V_{DD1}-V_{CM}$, i.e.:

$$V_{ds1}=V_{ds2}=V_{DD}-V_{CM} \quad (3)$$

The common-mode voltage $V_{CM}$ is adjusted in a closed-loop manner to be approximately equal to the reference voltage $V_{CMR}$ using the current source controller 210, which comprises an operational amplifier 211, a reference resistor $R_{ref1}$, and a capacitor 212. The first reference current $I_{ref1}$ flows from $V_{DD1}$ through $R_{ref1}$ and thus establishes the reference voltage $V_{CMR}$ to be lower than $V_{DD}$ by an amount of $I_{ref1}R_{ref1}$, that is:

$$V_{CMR}=V_{DD}-I_{ref1}R_{ref1} \quad (4)$$

Operational amplifier 211 amplifies a difference between $V_{CM}$ and $V_{CMR}$ into the first bias voltage $V_{B1}$, which is held by capacitor 212. When $V_{CM}$ rises (falls), operational amplifier 211 raises (lowers) $V_{B1}$ and cause the two bias currents $I_{B+}$ and $I_{B-}$ to increase (decrease), thus lowering (raising) $V_{2-}$ and $V_{2+}$ and consequently lowering (raising) $V_{CM}$. Therefore, $V_{CM}$ is thus adjusted in a negative feedback manner to be approximately equal to $V_{CMR}$. Using equation (4) and the understanding that $V_{CM}$ is approximately equal to $V_{CMR}$, it is clear that in a steady state of the zero-input scenario, both the drain-to-source voltage $V_{ds1}$ of NMOS transistor M1 and the drain-to-source voltage $V_{ds2}$ of NMOS transistor M2 are equal to $I_{ref1}R_{ref1}$, that is:

$$V_{ds1}=V_{ds2}=V_{DD}-V_{CM} \approx V_{DD}-V_{CMR}=I_{ref1}R_{ref1} \quad (5)$$

The over-drive voltage $V_{od1}$ of NMOS transistor M1 is:

$$V_{od1}=V_{B2}-V_{CM}-V_{th1} \quad (6)$$

Here, $V_{th1}$ denotes a threshold voltage of NMOS transistor M1. Using equations (2), and (6), we obtain:

$$V_{od1}=V_{DD}+V_{th0}+V_{od0}-I_{ref2}R_{ref2}-V_{CM}-V_{th1} \quad (7)$$

In an embodiment, NMOS transistors M0, M1, and M2 all have the same channel length and substantially the same threshold voltage, therefore, equation (7) can be simplified to:

$$V_{od1}=V_{DD}+V_{od0}-I_{ref2}R_{ref2}-V_{CM} \quad (8)$$

Using equations (5) and (8), we obtain:

$$V_{od1}=V_{od0}+I_{ref1}R_{ref1}-I_{ref2}R_{ref2} \quad (9)$$

The condition for NMOS transistor M1 to be in the saturation region is $V_{ds1} \geq V_{od1}$. Using equations (5) and (10), we can conclude that this condition can be written as:

$$I_{ref2}R_{ref2} \geq V_{od0} \quad (10)$$

Likewise, equation (10) is also the condition for NMOS transistor M2 to be in the saturation region.

In summary, $I_{ref2}$ and $R_{ref2}$ are chosen such that:

$$V_{th0} \geq I_{ref2}R_{ref2} \geq V_{od0} \quad (11)$$

Consequently, NMOS transistors M0, M1, and M2 are all in the saturation region.

CTLE 200 is functionally similar to CTLE 100, as an input signal of a higher frequency will have a higher gain due to a higher impedance of the active load 230 and a smaller impedance of the source degeneration circuit 250. However, CTLE 200 has advantages over CTLE 100. First, active inductors 231 and 232 are used, and a layout area can be greatly reduced. Second, the two bias currents $I_{B+}$ and $I_{B-}$ are controlled in a closed-loop manner. When an input common-mode voltage drops (rises) and causes the two bias currents $I_{B+}$ and $I_{B-}$ to drop (rise), the common-mode voltage $V_{CM}$ will rise (fall) accordingly and prompt the current source controller 210 to raise (lower) the first bias voltage $V_1$ to counter the change. This makes a gain of CTLE 200 insensitive to the input common-mode voltage. In addition, the active load is controlled by the active load controller to remain effective under a process, voltage, and temperature variation.

Source degeneration circuit 250 is used to degenerate a low frequency gain of CTLE 200 and thus boost a high frequency gain in a relative sense. Since the active load 230 can also boost a high frequency gain, source degeneration circuit 250 may not be needed if the active load 230 alone can readily provide sufficient high frequency boost. In an embodiment, source degeneration circuit 250 is replaced by a short circuit; in this case, there is no source degeneration.

Operational amplifiers are well known in the prior art and thus not described in detail here. Operational amplifier 211 can be embodied using whatever suitable operational amplifier circuit known in the prior art at a discretion of circuit designers.

Figure 3:
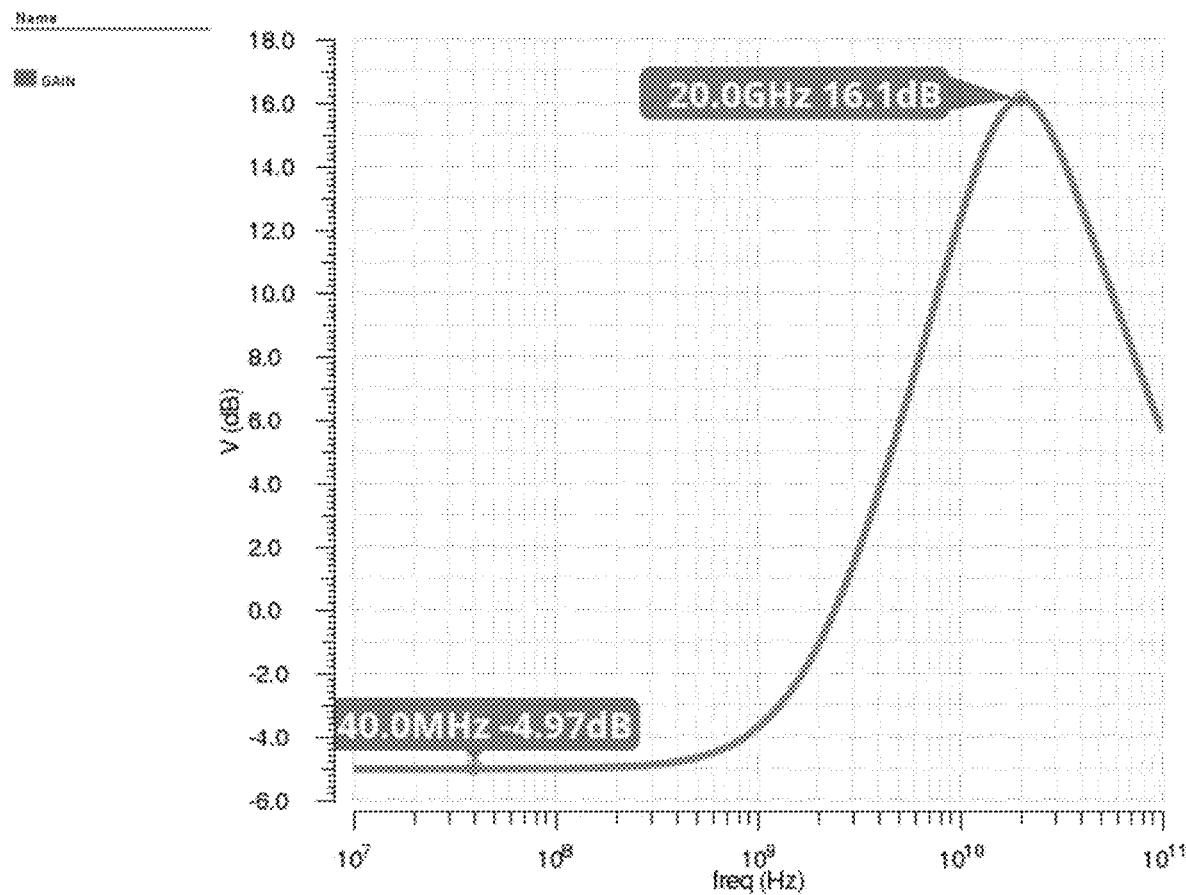
FIG. 3 shows a simulation result of a gain of the continuous-time linear equalizer of FIG. 2.

By way of example but not limitation: CTLE 200 is fabricated on a silicon substrate using a 12 nm CMOS process technology; $V_{DD}$ is 0.9V; $I_{ref1}$ is 100 µA; W/L (which stands for width/length) of NMOS transistors 221 and 222 are 5 µm/16 nm; resistor 251 is 2K Ohm; capacitor 252 is 50 fF; W/L of NMOS transistors 241 and 242 are 11 µm/16 nm; resistors 261 and 262 are 30 KOhm; W/L of NMOS transistors M1 and M2 are 500 nm/16 nm; resistors 233 and 234 are 6 KOhm; capacitors 235 and 256 are 5 fF; W/L of NMOS transistor M0 are 500 nm/16 nm; resistor $R_{ref2}$ is 2 KOhm; capacitor 275 is 30 pF; resistor $R_{ref1}$ is 3 KOhm; and capacitor 212 is 10 pF. A simulation result of a gain of CTLE 200 is shown in FIG. 3. The gains are −4.97 dB and 16.1 dB at 40 MHz and 20 GHz, respectively, and clearly embody an equalization function.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A CTLE (continuous-time linear equalizer) comprising:
a common-source amplifier configured to receive an input signal and output an output signal in accordance with a biasing current;
a current source controlled by a first bias voltage and configured to output the biasing current;
an active load controlled by a second bias voltage and configured as a load of the common-source amplifier;
a common-mode sensing circuit configured to sense a common-mode voltage of the output signal;
a current source controller configured to output the first bias voltage in accordance with the common-mode voltage and a reference voltage derived from a supply voltage of the active load and a first reference current; and
an active load controller configured to output the second bias voltage in accordance with the supply voltage of the active load and a second reference current.

2. The CTLE of claim 1, wherein a differential signaling scheme is used, the input signal comprises a first input voltage and a second input voltage, and the output signal comprises a first output voltage and a second output voltage.

3. The CTLE of claim 2, wherein the biasing current comprises a first bias current and a second bias current.

4. The CTLE of claim 3, wherein the common-source amplifier comprises two NMOS (n-channel metal oxide semiconductor) transistors configured to receive the first input voltage and the second input voltage and output the second output voltage and the first output voltage in accordance with the first bias current and the second bias current, respectively.

5. The CTLE of claim 4, wherein the current source comprises two NMOS transistors configured to output the first bias current and the second bias current in accordance with the first bias voltage.

6. The CTLE of claim 2, wherein the common-mode sensing circuit comprises a series connection of two resistors placed between the first output voltage and the second output voltage, and the common-mode voltage is tapped at a connection point of the two resistors.

7. The CTLE of claim 2 further comprising a source degeneration circuit configured to degenerate the common-source amplifier to lower a low frequency gain of the common-source amplifier.

8. The CTLE of claim 1, wherein the current source controller comprises a resistor configured to allow the first reference current to flow through from the supply voltage of the active load and thus establish the reference voltage, an operational amplifier configured to amplify a difference between the common-mode voltage and the reference voltage into the first bias voltage, and a capacitor configured to hold the first bias voltage.

9. The CTLE of claim 1, wherein the active load controller comprises an NMOS (n-channel metal oxide semiconductor) transistor configured to step up the supply voltage of the active load into the second bias voltage, a resistor configured to allow the second reference current to flow into the NMOS transistor and control an amount of the step up, and a capacitor configured to hold the second bias voltage.

10. The CTLE of claim 1, wherein the active load comprises an active inductor including an NMOS transistor, a gate resistor, and a gate-to-source capacitor, a source of the NMOS transistor being connected to the common-source amplifier, a drain of the NMOS transistor being connected to the supply voltage, a gate of the NMOS transistor being connected to the second bias voltage via the gate resistor, and the gate-to-source capacitor being placed across the gate and the source of the NMOS transistor.

* * * * *